(12) United States Patent
Lin

(10) Patent No.: US 6,576,486 B2
(45) Date of Patent: Jun. 10, 2003

(54) UNLANDED PROCESS IN SEMICONDUCTOR MANUFACTURE

(75) Inventor: Chin-Lung Lin, Hsinchu Hsien (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/767,307

(22) Filed: Jan. 23, 2001

(65) Prior Publication Data

US 2002/0094680 A1 Jul. 18, 2002

(30) Foreign Application Priority Data

Jan. 17, 2001 (TW) ........................................ 90101007 A

(51) Int. Cl.[7] ........................... H01L 21/66; H01L 21/76
(52) U.S. Cl. ........................... 438/17; 438/401; 438/462
(58) Field of Search ........................... 438/14, 16, 17, 438/18, 401, 462, 669, 926

(56) References Cited

U.S. PATENT DOCUMENTS

| | | | | |
|---|---|---|---|---|
| 5,610,831 A | * | 3/1997 | Matsumoto | ................. 364/491 |
| 5,879,844 A | * | 3/1999 | Yamamoto et al. | ............ 430/30 |
| 6,305,000 B1 | * | 10/2001 | Phan et al. | ...................... 716/5 |
| 6,365,504 B1 | * | 4/2002 | Chien et al. | ................. 438/624 |
| 2002/0028523 A1 | * | 3/2002 | Toyama et al. | ................ 438/14 |

* cited by examiner

Primary Examiner—Amir Zarabian
Assistant Examiner—Pamela Perkins
(74) Attorney, Agent, or Firm—Charles C. H. Wu; Wu & Cheung, LLP

(57) ABSTRACT

An unlanded process for manufacturing semiconductor circuits. Optical proximity correction of the electrical connection region of a conductive line is carried out to increase the area so that alignment accuracy between the conductive line and a via/contact improves. Optical proximity correction of the photomask for forming a conductive line pattern is carried out by first determining the electrical connection regions in the conductive line pattern. The regions are expanded equi-directionally or extended outward direction along the edges of the conductive line to form magnified regions. Overlapping regions between the original conductive line pattern and the magnified regions, regions outside the conductive line pattern as well as regions too close to neighboring conductive line pattern are removed. The final magnified regions and the original conductive line pattern are combined to obtain an optical proximity corrected photomask.

13 Claims, 3 Drawing Sheets

UNLANDED PROCESS IN SEMICONDUCTOR MANUFACTURE

CROSS-REFERENCE TO RELATED APPLICATION

This application claims the priority benefit of Taiwan application serial no. 90101007, filed Jan. 17, 2001.

BACKGROUND OF THE INVENTION

1. Field of Invention

The present invention relates to a method of fabricating interconnects for interconnecting semiconductor devices. More particularly, the present invention relates to an unlanded process for fabricating interconnects in an integrated circuit.

2. Description of Related Art

In the fabrication of semiconductors, semiconductor devices are connected by a multiple of interconnect layers. Inter-layer connections of various conductive layers are achieved by vias or contacts. To increase alignment margin between conductive lines and via/contact, a landed process or an unlanded process is used. In the landed process, area where the conductive line meets the via/contact is enlarged and distance between conductive lines is increased. Hence, the wider portion of a wider conductive line is prevented from getting too close to another conductive line. In the unlanded process, alignment between the conductive line and the via/contact is increased without increasing distance of separation between neighboring conductive lines. However, as the level of integration for electronic devices continues to increase, landed process of fabricating integrated circuit is gradually replaced by unlanded process.

Conventional unlanded process employs an optical proximity correction (OPC) mask to form conductive lines that connects electrically with via/contact. In general, serif or hammerhead pattern is inserted in a junction region between a conductive line and a via/contact so that alignment margin of the two is increased. Although the addition of serif or hammerhead pattern has definite benefit, alignment accuracy is not high enough to result in substantial improvement in the quality of electrical connection between a conductive line and via/contact.

SUMMARY OF THE INVENTION

Accordingly, one object of the present invention is to provide an unlanded process for manufacturing semiconductor circuits. An optical proximity correction of a electrical connection region of a conductive line is carried out to increase alignment accuracy between the conductive line and a via/contact. Optical proximity correction of a photomask for forming a conductive line pattern is carried out by first determining the electrical connection regions in the conductive line pattern. The regions are expanded equi-directionally or extended outward direction along the edges of the conductive line to form magnified regions. Overlapping regions between the original conductive line pattern and the magnified regions, regions outside the conductive line pattern as well as regions too close to neighboring conductive line pattern are removed. The final magnified regions and the original conductive line pattern are combined. Ultimately, an optical proximity corrected photomask for forming an accurate conductive line pattern is obtained.

In this invention, areas in the conductive line pattern where electrical connections are formed are magnified. Furthermore, areas in the magnified regions that are too close to neighboring conductive line pattern are deleted to prevent the wider section (due to magnification) of the conductive line getting too close to a neighboring conductive layer. Consequently, the unlanded process is able to increase alignment accuracy between the conductive line and via/contact without a corresponding increase in the distance of separation between neighboring conductive lines.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1A:
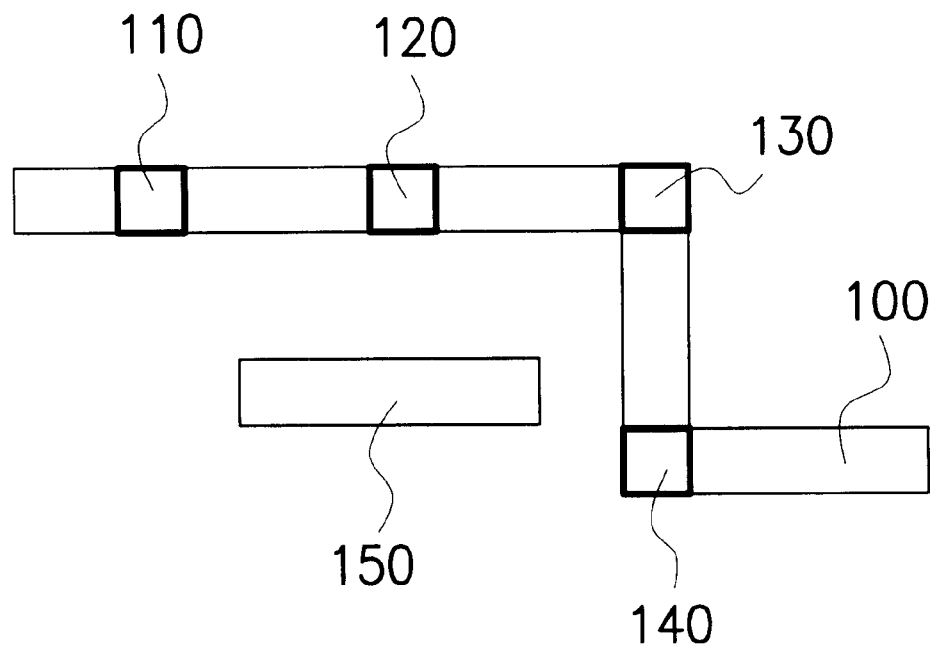
FIGS. 1A through 1D are schematic diagrams showing the progression of steps for carrying out an optical proximity correction of a photomask according to a first preferred unlanded process of this invention.

Reference will now be made in detail to the present preferred embodiments of the invention, examples of which are illustrated in the accompanying drawings. Wherever possible, the same reference numbers are used in the drawings and the description to refer to the same or like parts.

In this embodiment, a lower layer connected to a contact and an upper layer connected to the via of a conductive line is used to explain the method. The method of forming various contact/vias, the deposition of conductive lines, photolithographic and etching processes should be familiar to those skilled in the technology. Moreover, their details are not too relevant to this invention. Hence, actual process of forming contact/via and conductive line is not shown, only the method of producing a photomask for fabricating conductive line is shown.

An unlanded process includes several steps. First, a substrate having a plurality of contacts thereon is provided. A conductive line is formed on the substrate using a optical proximity corrected photomask obtained by employing either the first or the second embodiment of this invention. The conductive line is electrically connected with a lower layer contact. A plurality of vias electrically that connects with the conductive line is formed over the conductive line. The conductive line can be formed by depositing conductive material followed by patterning. Alternatively, the conductive line can be formed by performing a damascene process. A damascene process involves etching out a trench in the insulation layer and then depositing conductive material into the trench to form the conductive line.

FIGS. 1A through 1D are schematic diagrams showing the progression of steps for carrying out an optical proximity correction of a photomask according to a first preferred unlanded process of this invention. As shown in FIG. 1A, electrical connection regions 110, 120, 130 and 140 (marked out in thick lines in FIG. 1A) in the conductive line pattern 100 is determined. The electrical connection regions 110 and 130 are areas for connecting with lower contacts. On the other hand, the electrical connection regions 120 and 140 are areas for connecting with upper vias and conductive line. In addition, the electrical connection region 120 of the conductive line pattern 100 is close to a neighboring conductive line pattern 150.

Figure 1B:
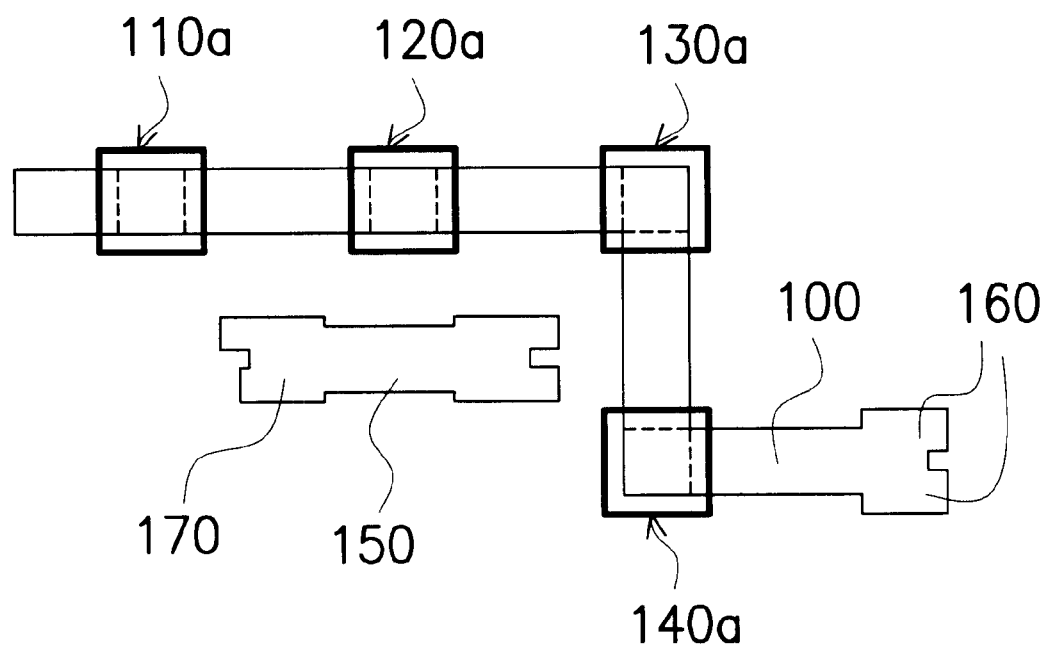

As shown in FIG. 1B, the optical proximity correction procedure according to this invention is initiated. First, all the electrical connection regions 110, 120, 130 and 140 are equi-directionally magnified (marked out by double dash lines and double solid lines) to obtain magnified regions 110a, 120a, 130a and 140a (enclosed by thick lines). In the meantime, serifs 160 and 170 for optical proximity correction are added to the end of the conductive line pattern 100 and 150 so that sharp corner profiles are obtained at the ends of the ultimately exposed pattern.

Figure 1C:
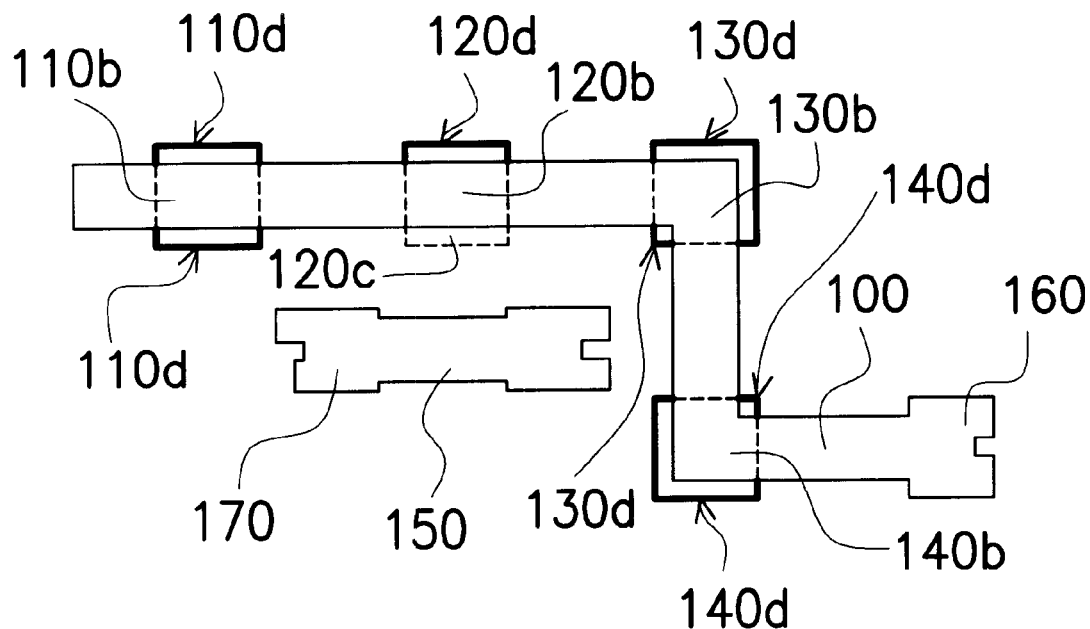

As shown in FIG. 1C, overlapping regions 110b, 120b, 130b, 140b (enclosed by dash lines and solid lines) in the conductive line pattern 100 are removed from the magnified regions 110a, 120a, 130a and 140a. In addition, region 120c outside the conductive line pattern 100 close to the conductive layer pattern 150 is also removed. Ultimately, only regions 110d, 120d, 130d and 140d remain. The region 120c within the magnified region 120a is removed to prevent the wider portion of the conductive line (caused by the magnification of region 120a) and the conductive layer (from conductive layer pattern 150) from getting too close. The method of removal includes simple design rule check (DRC). In a design rule check, removal is based on the measured distance of separation between the conductive line pattern 100 and the conductive layer pattern 150.

Figure 1D:
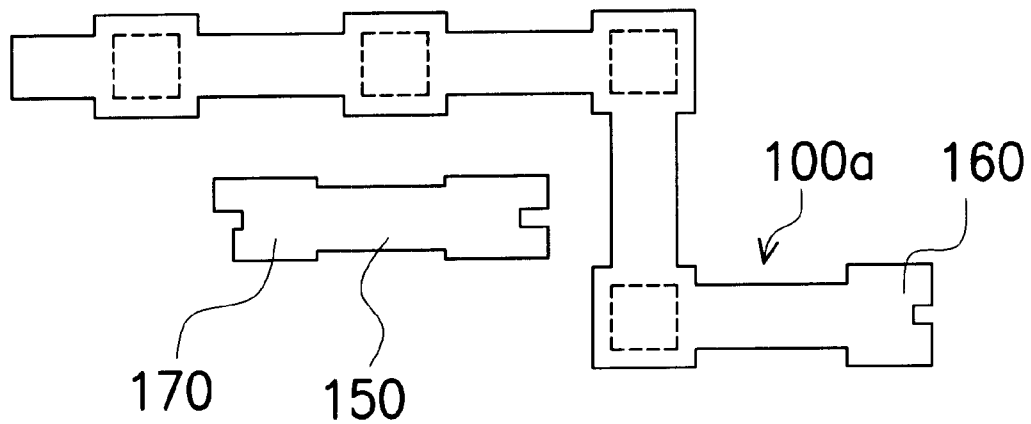

As shown in FIGS. 1C and 1D, the regions 110d, 120d, 130d and 140d are combined with the conductive line pattern 100 to obtain an optical proximity corrected conductive line pattern 100a. In FIG. 1D, the final conductive line pattern 100a is enclosed by solid lines while the original electrical connection regions 110, 120, 130 and 140 are enclosed by dashed lines for comparison.

Figure 2A:
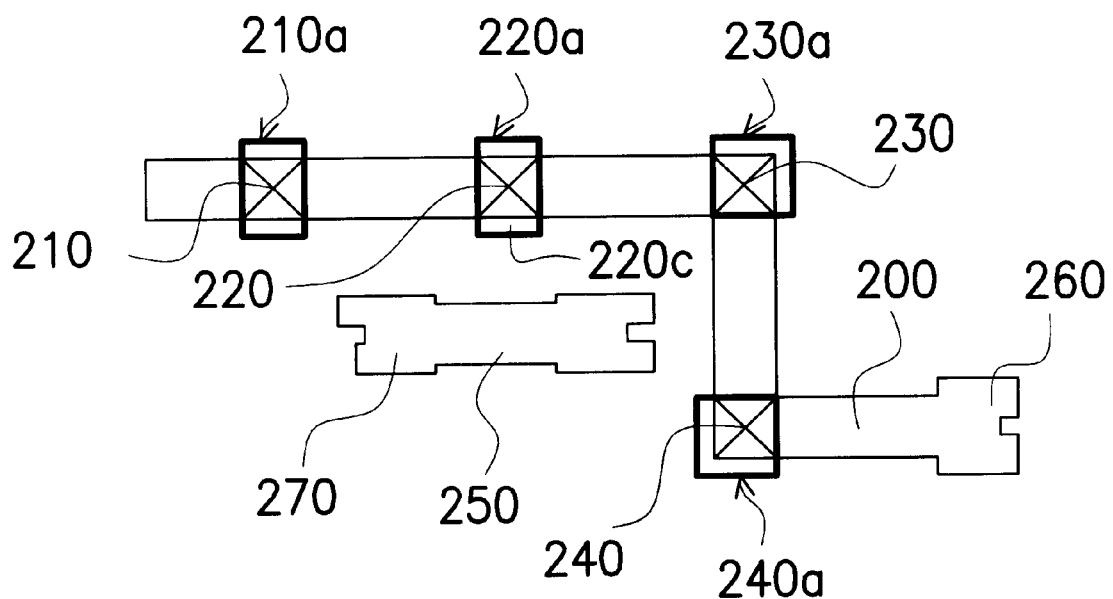
FIGS. 2A and 2B are schematic diagrams showing the progression of steps for carrying out an optical proximity correction of a photomask according to a second preferred unlanded process of this invention.
Figure 2B:
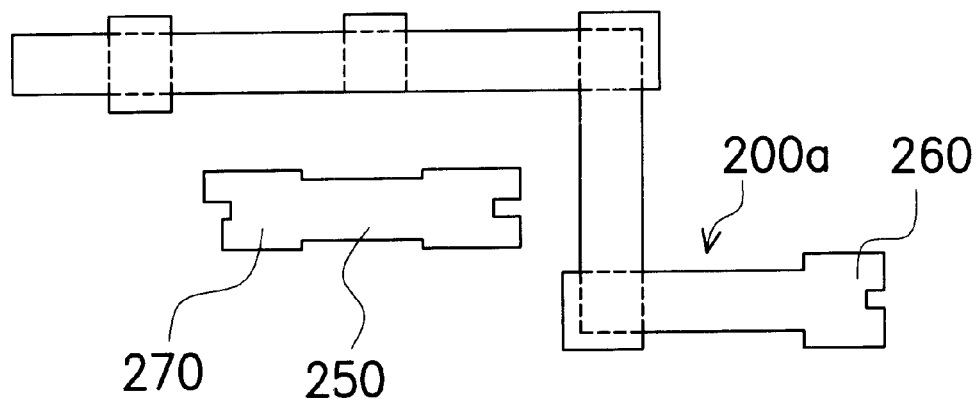

FIGS. 2A and 2B are schematic diagrams showing the progression of steps for carrying out an optical proximity correction of a photomask according to a second preferred unlanded process of this invention. As shown in FIG. 2A, electrical connection regions 210, 220, 230 and 240 (square box with an 'X' inside) for a conductive line pattern 200 is determined. The electrical connection regions 210 and 230 are areas for connecting with lower contacts. On the other hand, the electrical connection regions 220 and 240 are areas for connecting with upper vias and conductive lines. In addition, the electrical connection region 220 of the conductive line pattern 200 is close to a neighboring conductive line pattern 250. To initiate optical proximity correction, the outer edges of electrical connection regions 210, 220, 230 and 240 in the conductive line pattern 200 are extended to obtain magnified regions 210a, 220a, 230a and 240a (enclosed by thick black lines). Serifs 260 and 270 for optical proximity correction are added to the end of the conductive line pattern 200 and 250 so that sharp corner profiles are obtained at the ends of the ultimately exposed pattern. As shown in FIG. 2A, the magnified regions 210a and 220a along the straight line section of the conductive line pattern 200 is formed by the outward extension of the side edges of the electrical connection regions 210 and 220. The magnified regions 230a and 240a along the corner section of the conductive line pattern 200 is formed by the outward extension of a pair of corner edges.

As shown in FIGS. 2A and 2B, the magnified region 210a, 220a, 230a and 240a that overlaps with the conductive line pattern 200 is removed. In other words, the original electrical connection regions 210, 220, 230 and 240 are removed. In addition, region 220c outside the conductive line pattern 100 close to the conductive layer pattern 250 is also removed. The final pattern is combined with the conductive line pattern 200 to obtain an optical proximity corrected conductive line pattern 200a. The final conductive line pattern 100a is enclosed by solid lines while the original electrical connection regions 210, 220, 230 and 240 before magnification are enclosed by dashed lines for comparison. The region 220c within the magnified region 220a is removed to prevent the wider portion of the conductive line (caused by the magnification of region 220a) and the conductive layer (from conductive layer pattern 250) from getting too close. The method of removal includes simple design rule check (DRC). In a design rule check, removal is based on the measured distance of separation between the conductive line pattern 200 and the conductive layer pattern 250.

In this invention, the electrical connection regions 120, 140, 220, 240 (110, 130, 210, 230) (enclosed by dash lines in FIGS. 1D and 2B) in a conductive line pattern 100(200) for connecting with via/contact are expanded. In addition, the region 120c (220c) within the magnified region 120a (220a) is removed to prevent the conductive line (obtained from the conductive line pattern 100a (200a)) from getting too close to the other conductive layer (obtained from the conductive layer pattern 150 (250). Therefore, the invention is able to increase alignment accuracy and hence process window without increasing distance of separation between conductive lines.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical proximity correction process used to electrically connect a conductive line with a via/contact in an unlanded porcess, the optical proximity correction process comprising the steps of:

determining a conductive line pattern that corresponds to the conductive line;
   determining electrical connection regions in the conductive line pattern;
   respectively magnifying the electrical connection regions equi-directionally to form correspondingly magnified regions;
   subsequently removing from the magnified regions areas that overlap with the conductive line pattern as well as areas outside the conductive line pattern close to a neighboring conductive line pattern to form a final pattern; and
   forming a photomask including the final pattern and the conductive line in order to define the conductive line to be electrically connected with the via/contact.

2. The process of claim 1, wherein the step of removing from the magnified regions those areas outside the conductive line pattern close to neighboring conductive line pattern includes conducting a design rule check (DRC) based on the pitch of separation between conductive line pattern.

3. The process of claim 1, wherein the step of performing optical proximity correction further includes adding optical proximity correction serifs to the ends of conductive line pattern.

4. The process of claim 1, wherein the step of forming the conductive lines include depositing a conductive material to form a conductive layer and then patterning the conductive layer.

5. The process of claim 1, wherein step of forming the conductive lines includes a damascene process.

6. An optical proximity correction process used to electrically connect a conductive line with a via/contact in an unlanded porcess, the optical proximity correction process, the optical proximity correction process comprising the step of:

determining a conductive line pattern that corresponds to the conductive line;
determining electrical connection regions in the conductive line pattern;
respectively expanding the electrical connection regions from the side edges of the conductive line pattern to form corresponding magnified regions;
subsequently removing from the magnified regions areas that overlap with the conductive line pattern as well as areas outside the conductive line pattern close to a neighboring conductive line pattern to form a final pattern; and
forming a photomask including the final pattern and the conductive line pattern to define the conductive line to be electrically connected with the via/contact.

7. The process of claim 6, wherein the electrical connection region is within a straight line section of the conductive line pattern and the two expansion directions are perpendicular to the straight line.

8. The process of claim 6, wherein the electrical connection region is a corner region of the conductive line pattern and the two expansion directions are perpendicular to a pair of edges at the external corner of the corner region.

9. The process of claim 6, wherein the step of removing from the magnified regions those areas outside the conductive line pattern close to neighboring conductive line pattern includes conducting a design rule check (DRC) based on the pitch of separation between conductive line pattern.

10. The process of claim 6, wherein the step of performing optical proximity correction further includes adding optical proximity correction serifs to the ends of conductive line pattern.

11. The process of claim 6, wherein the step of forming the conductive lines include depositing a conductive material to form a conductive layer and then patterning the conductive layer.

12. The process of claim 6, wherein step of forming the conductive lines includes a damascene process.

13. The process of claim 6, wherein the electrical connection region is within a straight-line section of the conductive line pattern and the two expansion directions are perpendicular to the straight line.

* * * * *

UNITED STATES PATENT AND TRADEMARK OFFICE
CERTIFICATE OF CORRECTION

| | |
|---|---|
| PATENT NO. | : 6,576,486 B2 |
| APPLICATION NO. | : 09/767307 |
| DATED | : June 10, 2003 |
| INVENTOR(S) | : Chin-Lung Lin and Hsinchu Hsien |

It is certified that error appears in the above-identified patent and that said Letters Patent is hereby corrected as shown below:

Delete fig. 1D, and substitute the fig. below therefor.

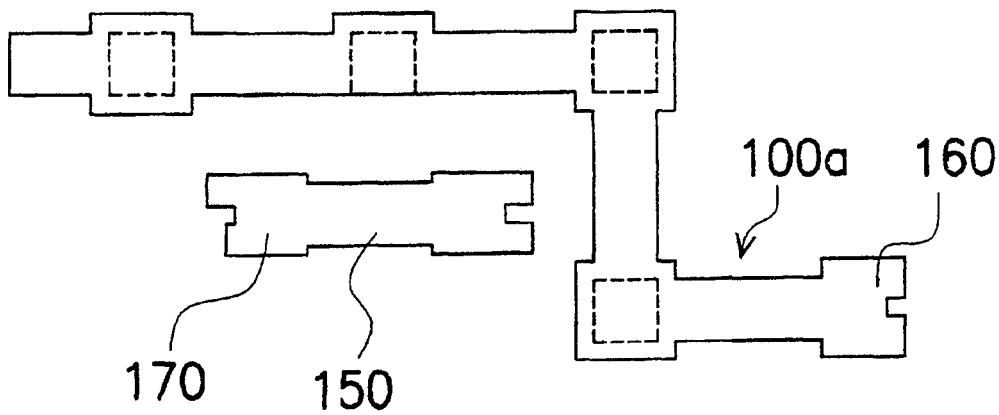

FIG. 1D

In the claims,

Col. 4, line 42, "porcess" should be changed to --process--.

Col. 4, line 61, insert --the-- before "neighboring conductive line pattern"; line 62, the last word "the" should be changed to --a--; line 63, "between conductive line pattern" should be changed to --between the conductive line pattern and the neighboring conductive line pattern--.

Col. 4, lines 64-65, cancel the text beginning with "wherein" to and ending "correction"; line 65, "includes" should be changed to --comprising--; line 66, cancel "the" before "ends" and insert --the-- before "conductive".

Signed and Sealed this
Twenty-fourth Day of May, 2011

David J. Kappos
*Director of the United States Patent and Trademark Office*

CERTIFICATE OF CORRECTION (continued)

U.S. Pat. No. 6,576,486 B2

Col. 5, line 1, cancel the text "the step of forming"; line 2, "lines" should be changed to --line-- and "include" should be changed to --is formed by--.

Col. 5, line 5, cancel the text "step of forming"; line 6, "lines" should be changed to --line-- and "includes" should be changed to --is formed by--.

Col. 5, line 9, "porcess" should be changed to --process-- and cancel the text "the optical proximity correction process,"; line 10, "step" should be changed to --steps--; line 11, cancel "the" before "side edges".

Col. 5, line 28, "region is" should be changed to --regions are--.

Col. 6, line 1, cancel the text "the two expansion" and insert --of expanding the electrical connection regions-- between "directions" and "are"; line 2, insert --section-- after "line".

Col. 6, line 3, insert --one of-- before "the electrical"; line 4, "region" should be changed to --regions--; line 5, cancel the text "the two expansion" and insert --of expanding the electrical connection regions-- between "directions" and "are".

Col. 6, line 10, insert --the-- before "neighboring conductive line pattern"; line 11, the last word "the" should be changed to --a--; line 12, "between conductive line pattern" should be changed to --between the conductive line pattern and the neighboring conductive line pattern--.

Col. 6, lines 13-14, cancel the text beginning with "wherein" to and ending "correction"; line 14, "includes" should be changed to --comprising--; line 15, cancel "the" before "ends" and insert --the-- before "conductive".

Col. 6, line 17, cancel the text "the step of forming"; line 18, "lines" should be changed to --line-- and "include" should be changed to --is formed by--.

Col. 6, line 21, cancel the text "step of forming"; line 22, "lines" should be changed to --line-- and "includes" should be changed to --is formed by--.